US011961549B2

(12) United States Patent
Lee et al.

(10) Patent No.: US 11,961,549 B2
(45) Date of Patent: Apr. 16, 2024

(54) DATA STORAGE DEVICE FOR REFRESHING DATA AND OPERATING METHOD THEREOF

(71) Applicant: SK hynix Inc., Gyeonggi-do (KR)

(72) Inventors: Seon Ju Lee, Gyeonggi-do (KR); Da Seul Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 58 days.

(21) Appl. No.: 17/702,267

(22) Filed: Mar. 23, 2022

(65) Prior Publication Data

US 2023/0069656 A1 Mar. 2, 2023

(30) Foreign Application Priority Data

Aug. 27, 2021 (KR) .................. 10-2021-0114059

(51) Int. Cl.
*G11C 11/406* (2006.01)
*G11C 11/4076* (2006.01)
*G11C 11/4096* (2006.01)

(52) U.S. Cl.
CPC .. *G11C 11/40622* (2013.01); *G11C 11/40615* (2013.01); *G11C 11/4076* (2013.01); *G11C 11/4096* (2013.01)

(58) Field of Classification Search
CPC ........ G11C 11/40622; G11C 11/40615; G11C 11/4076; G11C 11/4096
See application file for complete search history.

(56) References Cited

U.S. PATENT DOCUMENTS

| | | | |
|---|---|---|---|
| 8,867,294 B2 * | 10/2014 | Kajigaya | G11C 11/406 365/222 |
| 9,524,771 B2 * | 12/2016 | Sriramagiri | G11C 11/40618 |
| 10,048,863 B1 * | 8/2018 | Goss | G06F 3/0619 |
| 10,089,170 B1 * | 10/2018 | Goss | G06F 11/073 |
| 10,592,134 B1 * | 3/2020 | Goss | G11C 16/3431 |
| 11,409,446 B2 * | 8/2022 | Liu | G11C 16/3495 |
| 2016/0124679 A1 | 5/2016 | Huang et al. | |

FOREIGN PATENT DOCUMENTS

KR 10-2014-0146333 A 12/2014

* cited by examiner

*Primary Examiner* — Son L Mai
(74) *Attorney, Agent, or Firm* — IP & T GROUP LLP (57) ABSTRACT

A data storage device may include a storage including a plurality of storage regions each composed of a plurality of pages; and a controller. The controller is configured to select a plurality of target open regions from open regions among the storage regions on the basis of health information of the open regions, in each of which a programmed page and an unprogrammed page coexist, and perform control so that refresh operations for the respective target open regions are performed in a time-distributed manner.

19 Claims, 9 Drawing Sheets

| Region NO. | Read Count | # of Program Page | Open Time Counter |
|---|---|---|---|
|  |  |  |  |
|  |  |  |  |
| ⋮ | ⋮ | ⋮ | ⋮ |

DATA STORAGE DEVICE FOR REFRESHING DATA AND OPERATING METHOD THEREOF

CROSS-REFERENCES TO RELATED APPLICATION

The present application claims priority under 35 U.S.C. § 119(a) to Korean Patent application number 10-2021-0114059, filed on Aug. 27, 2021, which is incorporated herein by reference in its entirety.

BACKGROUND

1. Technical Field

Various embodiments of the present disclosure generally relate to a semiconductor integrated apparatus, and more particularly, to a data storage device and an operating method thereof.

2. Related Art

Data stored in memory cells of a semiconductor memory apparatus may be lost or its value may be changed over time.

Data retention characteristics of memory cells are affected by various factors such as the frequency of access to memory cells or adjacent memory cells, and the design structure of the memory cells.

Since the loss or deformation of data reduces the reliability of the memory apparatus, a method capable of solving this issue is required.

SUMMARY

A data storage device in accordance with an embodiment of the present disclosure may include: a storage including a plurality of storage regions each composed of a plurality of pages; and a controller. The controller is configured to select a plurality of target open regions from open regions among the storage regions on the basis of health information of the open regions, in each of which a programmed page and an unprogrammed page coexist, and perform control so that refresh operations for the respective target open regions are performed in a time-distributed manner.

A data storage device in accordance with an embodiment of the present disclosure may include: a storage including a plurality of storage regions each composed of a plurality of pages, at least a part of the storage regions being open regions, in each of which a programmed page and an unprogrammed page coexist; an open region manager configured to select, as target open regions, at least a part of open regions, a read count of each of which is equal to or greater than a threshold value among the open regions; and a refresh controller configured to set a refresh period so that refresh time points of the respective target open regions are distributed on the basis of disturbance vulnerability of each of the target open regions.

An operating method of a data storage device in accordance with an embodiment of the present disclosure is an operating method of a data storage device including a storage and a controller, and may include: generating, by the storage, open regions, in each of which a programmed page and an unprogrammed page coexist; selecting, by the controller, a plurality of target open regions on the basis of health information of the open regions; and performing, by the controller, control so that refresh operations for the respective target open regions are performed in a time-distributed manner.

DETAILED DESCRIPTION

Hereinafter, embodiments of the present disclosure will be described in more detail with reference to the accompanying drawings.

Figure 1:
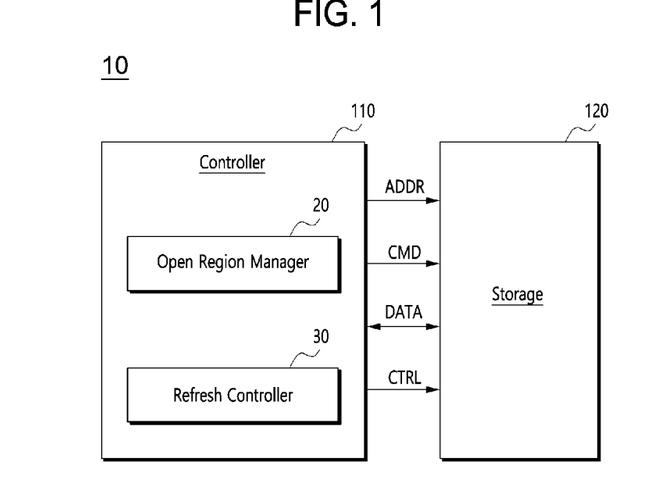
FIG. 1 is a configuration diagram of a data storage device in accordance with an embodiment of the present disclosure.

FIG. 1 is a configuration diagram of a data storage device 10 in accordance with an embodiment of the present disclosure.

Referring to FIG. 1, the data storage device 10 may include a controller 110 and a storage 120.

The controller 110 may write data DATA in the storage 120 or read the data DATA stored in the storage 120.

In order to write the data DATA in the storage 120, the controller 110 transmits a command CMD, an address ADDR, a control signal CTRL, and the data DATA to the storage 120. In order to read the data DATA stored in the storage 120, the controller 110 transmits the command CMD, the address ADDR, and the control signal CTRL to the storage 120.

The storage 120 may perform operations, such as writing, reading, and erasing of the data DATA, in response to signals received from the controller 110.

The storage 120 may be implemented using a memory device selected from various nonvolatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The storage 120 includes a memory cell array having memory cells arranged between a plurality of rows (word lines) and a plurality of columns (bit lines). Each memory cell may store 1-bit (single bit) data or multibit (M)-data, where M is an integer equal to or greater than 2. The storage 120 may include a plurality of dies, a plurality of chips, or a plurality of packages.

A set number of memory cells may form a unit page, and the storage 120 may be managed in units of a memory block including a plurality of pages, a super block obtained by grouping a plurality of memory blocks, and a zone obtained by grouping a plurality of pages, a plurality of memory blocks, or a plurality of super blocks. In the following description, a memory region refers to a management unit of the memory block including a plurality of pages, the super block, the zone, or a memory apparatus similar thereto.

The concept of a zone or a zone namespace (ZNS) has been introduced to provide high performance without interference between a plurality of operating systems and a plurality of application programs in a multi-tenant environment. ZNS is a concept in which each of the plurality of application programs sequentially stores data in a zone allocated thereto. Zones are logically and physically divided spaces. In each zone, similar data may be gathered, sequentially stored, and erased in units of zones.

That is, the storage 120 may be divided into a plurality of regions, and each region may include a plurality of pages.

The controller 110 may include an open region manager 20 and a refresh controller 30.

The open region manager 20 may be configured to manage health information of an open region which is a memory region where a page in a programmed state and a page in an unprogrammed state coexist, among a plurality of memory regions. The unprogrammed state may be understood to be equivalent to an erase state. In addition, the open region manager 20 may trigger an early refresh operation on the basis of the health information of the open region.

In an embodiment, the health information of the open region may include first health information including a read count. The health information of the open region may further include second health information including the number of programmed pages within the open region and/or an elapsed time after the open region is generated. The second health information may be referred to as open state retention characteristics.

Since the data retention characteristics of a semiconductor memory apparatus deteriorate as time elapses after data storage, data needs to be substantially maintained in an intact state through a refresh operation.

In a flash memory apparatus, since a read disturb phenomenon occurs in which charges stored in a charge storage layer are lost through a channel layer by a voltage applied through a read operation, a refresh operation may be performed by copying data in a memory region, whose reliability is reduced due to an excessive read operation, back to an intact or healthy memory region. In an embodiment, it may be possible to perform a normal refresh operation of setting a threshold of a read count per memory region and then moving data in a memory region, whose read count has reached the threshold, to another memory region.

That is, the normal refresh operation refers to a refresh operation based on a read count for each of all memory regions.

Moreover, the open region has weak read disturb and data retention characteristics due to interference between a programmed page and an unprogrammed page.

The open region manager 20 in accordance with the present disclosure may collect first and second health information of each open region. The first health information includes a read count for each open region and second health information includes the number of programmed pages and/or an elapsed time after each open region is generated, and select a plurality of target open regions, on which an early refresh operation is to be performed, on the basis of the collected first health information.

That is, the early refresh operation refers to a refresh operation based on the health information of the open memory region.

The refresh controller 30 may determine a refresh time point so that the plurality of target open regions are refreshed at different time points.

In an embodiment, the refresh controller 30 may analyze disturbance vulnerability on the basis of the number of programmed pages within each target open region and/or an elapsed time after each target open region is generated. The refresh controller 30 may determine a refresh priority according to the disturbance vulnerability and allow the refresh time points of the target open regions to be distributed according to the determined priority.

The refresh operation may be an operation of moving or copying back data in a memory region having a weak read disturb characteristic to another memory region.

Figure 2:
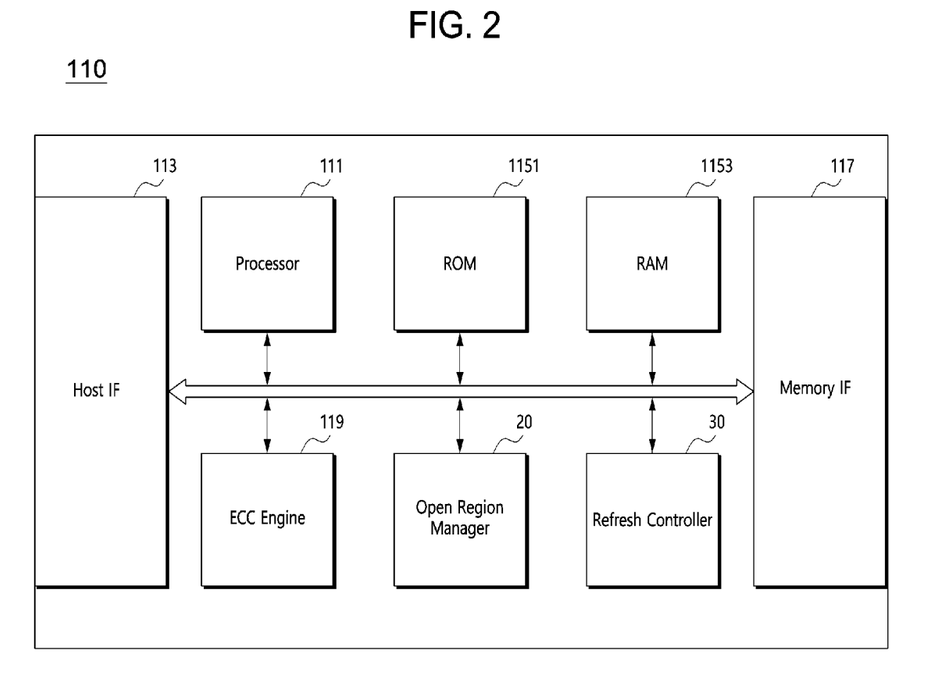
FIG. 2 is a configuration diagram of a controller in accordance with an embodiment of the present disclosure.

FIG. 2 is a configuration diagram of the controller 110 in accordance with an embodiment of the present disclosure.

Referring to FIG. 2, the controller 110 in accordance with an embodiment may include a processor 111, a host interface (IF) 113, a ROM 1151, a RAM 1153, a memory interface (IF) 117, an ECC engine 119, the open region manager 20, and the refresh controller 30.

The processor 111 may control overall operations of the controller 110. In an embodiment, the processor 111 may be configured to transfer various control information necessary for a data read or write operation on the storage 120 to the host IF 113, the RAM 1153, the memory IF 117, and the ECC engine 119. In an embodiment, the processor 111 may be configured as hardware capable of executing firmware provided for various operations of the data storage device 10. In an embodiment, the processor 111 may perform a function of a flash translation layer (FTL) for performing garbage collection, address mapping, wear leveling, and the like for managing the storage 120.

The host IF 113 may receive a command, an address, and a clock signal from a host device under the control of the processor 111, further receive data according to circumstances, and provide a communication channel for controlling data input/output. Particularly, the host IF 113 may provide physical connection between the host device and the data storage device 10. Furthermore, the host IF 113 may provide interfacing with the data storage device 10 in correspondence to a bus format of the host device. The bus format of the host device may include at least one of communication standards or interfaces such as a secure digital, a universal serial bus (USB), a multi-media card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral component interconnection (PCI), a PCI express (PCI-e or PCIe), and a universal flash storage (UFS).

The ROM 1151 may store program codes necessary for the operation of the controller 110, for example, firmware or software, and code data and the like used by the program codes.

The RAM 1153 may store data necessary for the operation of the controller 110 or data generated by the controller 110.

That is, the RAM 1153 may be used as a cache memory, a buffer memory, a working memory, and the like of the controller 110.

The memory IF 117 may provide a communication channel for signal transmission/reception between the controller 110 and the storage 120. The memory IF 117 may transmit data temporarily stored in a buffer memory to the storage 120 or transfer data read from the storage 120 to the buffer memory, under the control of the processor 111.

The ECC engine 119 may be configured to detect and correct an error of data exchanged with the storage 120. In an embodiment, the ECC engine 119 may ECC-encode data stored in the storage 120 or ECC-decode data read from the storage 120.

Figure 3:
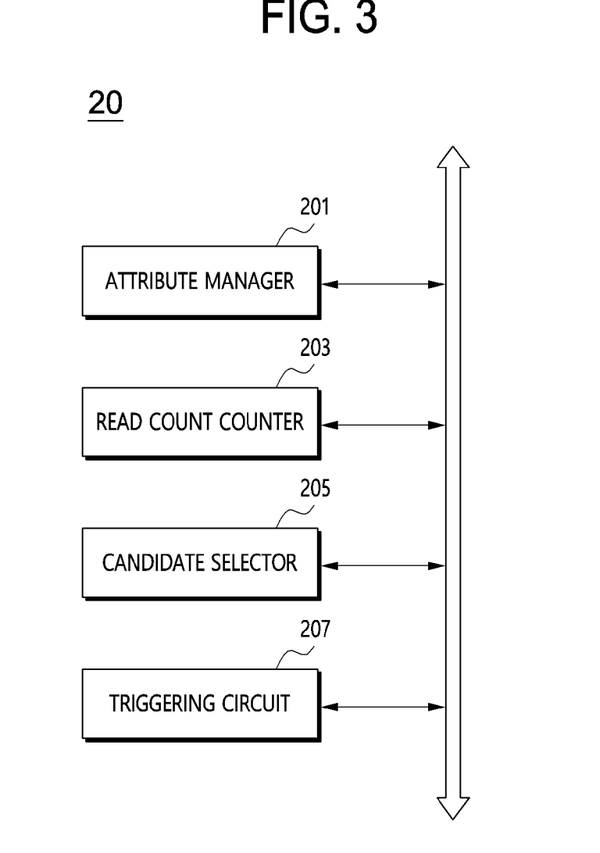
FIG. 3 is a configuration diagram of an open region manager in accordance with an embodiment of the present disclosure.

FIG. 3 is a configuration diagram of the open region manager 20 in accordance with an embodiment of the present disclosure.

Referring to FIG. 3, the open region manager 20 in accordance with an embodiment may include an attribute manager 201, a read count counter 203, a candidate selector 205, and a triggering circuit 207. The open region manager 20, attribute manager 201, read count counter 203, candidate selector 205, and triggering circuit 207 include all circuits, systems, software, firmware and devices necessary for their respective operations and functions.

The attribute manager 201 may register a memory region, where a programmed page and an unprogrammed page coexist, among memory regions, on which a program operation has been completed in response to the host device or an internal program command, as an open region. In addition, the attribute manager 201 may manage open state retention characteristics for each open region. The open state retention characteristics for each open region may include the number of programmed pages within each open region and/or an elapsed time after each open region is generated.

The read count counter 203 may count the number of read accesses to each open region.

Figure 4:
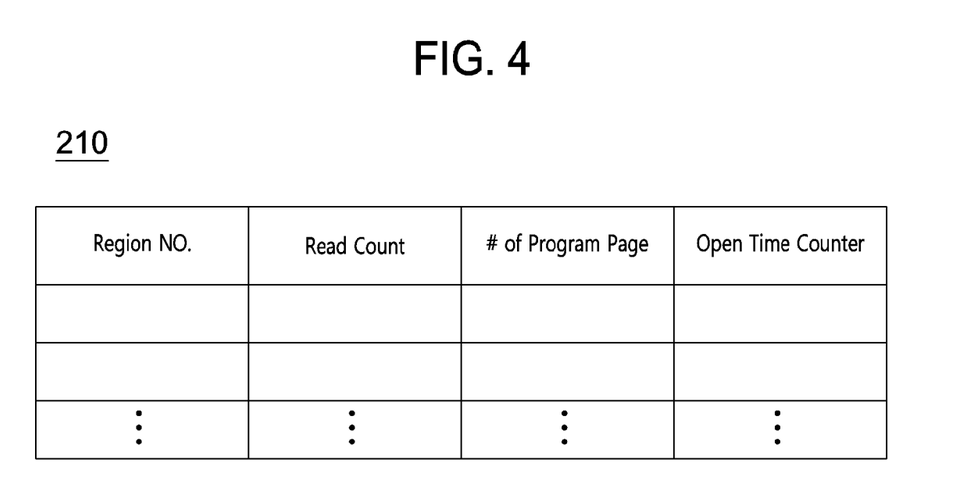
FIG. 4 is a diagram for describing open region management information in accordance with an embodiment of the present disclosure.

FIG. 4 is a diagram for describing open region management information in accordance with an embodiment of the present disclosure.

According to the operation of the open region manager 20, health information including a read count (Read Count) for each of storage regions registered as open regions, the number of programmed pages (# number of Program Page) within each of the open regions, and/or an elapsed time (Open Time Counter) after each of the open regions is generated may be managed as illustrated in FIG. 4.

The candidate selector 205 may include an open region read-accessed by a first threshold value TH_RC or more, among open regions, in a candidate list of the early refresh operation.

The triggering circuit 207 may trigger the early refresh operation when the number of open regions included in the candidate list is equal to or greater than a second threshold value TH_VIC. In addition, the triggering circuit 207 may select at least a part of the open regions, a read count of each of which is equal to or greater than the first threshold value TH_RC, for example, open regions, whose number corresponds to the second threshold value TH_VIC, as target open regions of the early refresh operation.

Figure 5:
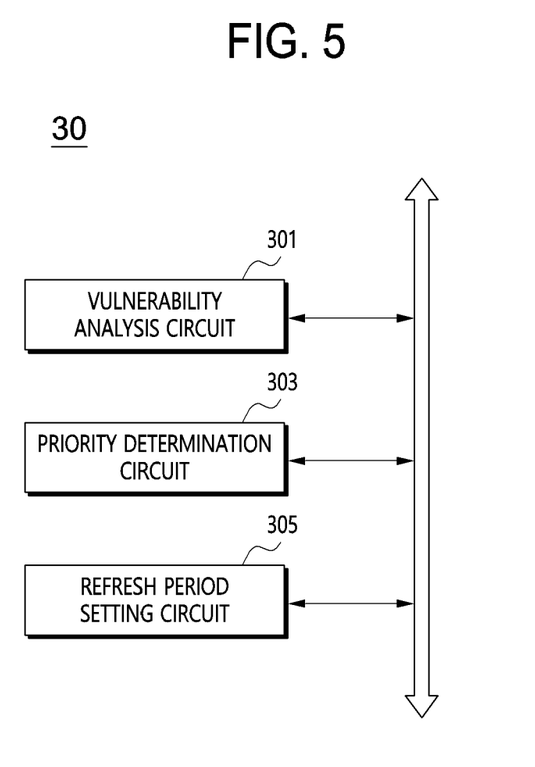
FIG. 5 is a configuration diagram of a refresh controller in accordance with an embodiment of the present disclosure.

FIG. 5 is a configuration diagram of the refresh controller 30 in accordance with an embodiment of the present disclosure.

Referring to FIG. 5, the refresh controller 30 in accordance with an embodiment may include a vulnerability analysis circuit 301, a priority determination circuit 303, and a refresh period setting circuit 305.

The vulnerability analysis circuit 301 may analyze disturbance vulnerability for each of the open regions, which is selected as the target open region by the open region manager 20, as the early refresh operation is triggered. In an embodiment, the vulnerability analysis circuit 301 may analyze disturbance vulnerability of each target open region on the basis of the number of programmed pages within each target open region and/or an elapsed time after each target open region is generated.

In an embodiment, the vulnerability analysis circuit 301 may analyze disturbance vulnerability as expressed by Equation 1 below, on the basis of the number X of programmed pages within each target open region, a weight a for the number X, an elapsed time Y after each target open region is generated, and a weight b for the elapsed time Y.

$$\text{Disturbance Vulnerability} = a \times 1/X + bY \qquad \text{[Equation 1]}$$

Accordingly, it can be analyzed that the disturbance vulnerability of a target open region is low when the number of programmed pages within the target open region is large and the elapsed time after the target open region is generated is short and the disturbance vulnerability of a target open region is high when the number of programmed pages within the target open region is small and the elapsed time after the target open region is generated is long.

The priority determination circuit 303 may determine a priority N of each target open region for the early refresh operation on the basis of the disturbance vulnerability for each target open region analyzed by the vulnerability analysis circuit 301. In an embodiment, when the disturbance vulnerability is high, the priority of a target open region may be determined to be high. When the second threshold value TH_VIC is M, where M is an integer equal to or greater than 2, a priority N_M of each of the M target open regions may have a value increasing from 0 to M in descending order of the disturbance vulnerability.

For example, when the vulnerabilities of target open regions A to D are 1, 10, 3, and 100, respectively, the priority N_A of the target open region A may be determined to be 3, the priority N_A of the target open region B may be determined to be 1, the priority N_A of the target open region C may be determined to be 2, and the priority N_A of the target open region D may be determined to be 0.

| Region NO. (M) | Disturbance Vulnerability | Priority N_M |
| --- | --- | --- |
| A | 1 | 3 |
| B | 10 | 1 |
| C | 3 | 2 |
| D | 100 | 0 |

The refresh period setting circuit 305 may set a refresh period for each target open region so that refresh time points are distributed for the target open regions. When the reference value P_EARLYREF of an early refresh period and the reference value P_NORMREF of a normal refresh period for the open region are set, an early refresh period P_EARLYREF_M of each of the M target open regions may be determined as expressed by Equation 2 below, for example.

$$P\_EARLYREF\_M = \frac{P\_NORMREF - P\_EARLYREF}{M} \times N\_M \qquad \text{[Equation 2]}$$

Accordingly, the refresh period setting circuit 305 may set the refresh period so that the refresh time points are distributed for the target open regions, which have been read a predetermined number of times or more, according to the open state retention characteristics.

When refresh operations are performed on the target regions at the same time, a host's request may be delayed and processed. In the present disclosure, the refresh operations on target open regions each requiring early refresh are performed in a time-distributed manner, i.e., performed at different time points, so that it is possible to process a host's request without delay while ensuring data retention characteristics.

Figure 6:
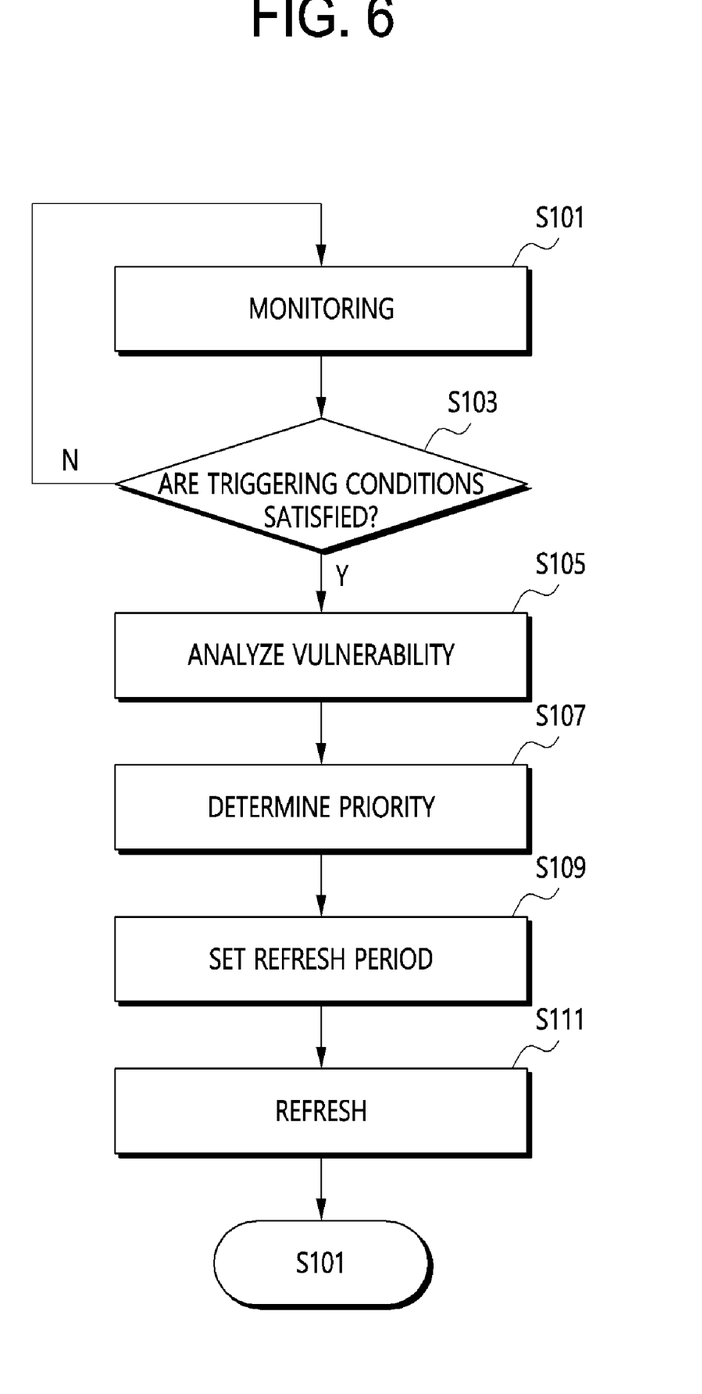
FIG. 6 is a flowchart for describing an operating method of the data storage device in accordance with an embodiment of the present disclosure.

FIG. 6 is a flowchart for describing an operating method of the data storage device 10 in accordance with an embodiment of the present disclosure.

The controller 110 may monitor the state of the storage 120 (S101). For example, when an open region is generated in the storage 120, the controller 110 may monitor health information of the open region (S101). In an embodiment, the controller 110 may be configured to manage health information on an open region which is a memory region, where a programmed page and an unprogrammed page coexist, among memory regions, where a program operation has been completed in response to the host device or the internal program command. The health information of the open region may include the first health information including a read count of the open region and may further include the second health information including the number of programmed pages within the open region and/or an elapsed time after the open region is generated.

The controller 110 may confirm whether the health information of the open region satisfies early refresh operation triggering conditions (103). When the health information of the open region does not satisfy the early refresh operation triggering conditions (S103: N), the controller 110 continuously monitors the health information of the open region (S101).

When the health information of the open region satisfies the early refresh operation triggering conditions (S103: Y), the controller 110 may analyze disturbance vulnerability for target open regions (S105).

In an embodiment, the controller 110 may analyze disturbance vulnerability of a target open region on the basis of the second health information of the target open region, which is open state retention characteristics of the target open region, that is, the number of programmed pages within the target open region and/or the elapsed time after the target open region is generated. In an embodiment, the controller 110 may analyze disturbance vulnerability of the target open region as expressed by Equation 1 above, on the basis of the number X of programmed pages within the target open region, the weight a for the number X, the elapsed time Y after the target open region is generated, and the weight b for the elapsed time Y; however, the present technology is not limited thereto.

The controller 110 may determine the refresh priority of each target open region on the basis of the disturbance vulnerability analysis result in operation S105 (S107). In an embodiment, when the disturbance vulnerability of a target open region is higher, the priority of the target open region may be determined to be high.

The controller 110 may set a refresh period for each target open region so that the refresh time points are distributed for the target open regions on the basis of the priority of each target open region determined in operation S107 (S109), and perform control so that refresh operations are performed on the target open regions according to the set period, i.e., in the time-distributed manner (S111).

In an embodiment, the controller 110 may set a refresh period of the refresh operation on each target operation on the basis of Equation 2 above; however, the present disclosure is not limited thereto.

Accordingly, the controller 110 may determine the refresh priority of a target open region and a period of a refresh operation to be performed on the target open region on the basis of the number of programmed pages within the target open region, which has been read a predetermined number of times or more, and/or an elapsed time after the target open region is generated, and perform control so that refresh operations for the target open regions are performed in the time-distributed manner.

Figure 7:
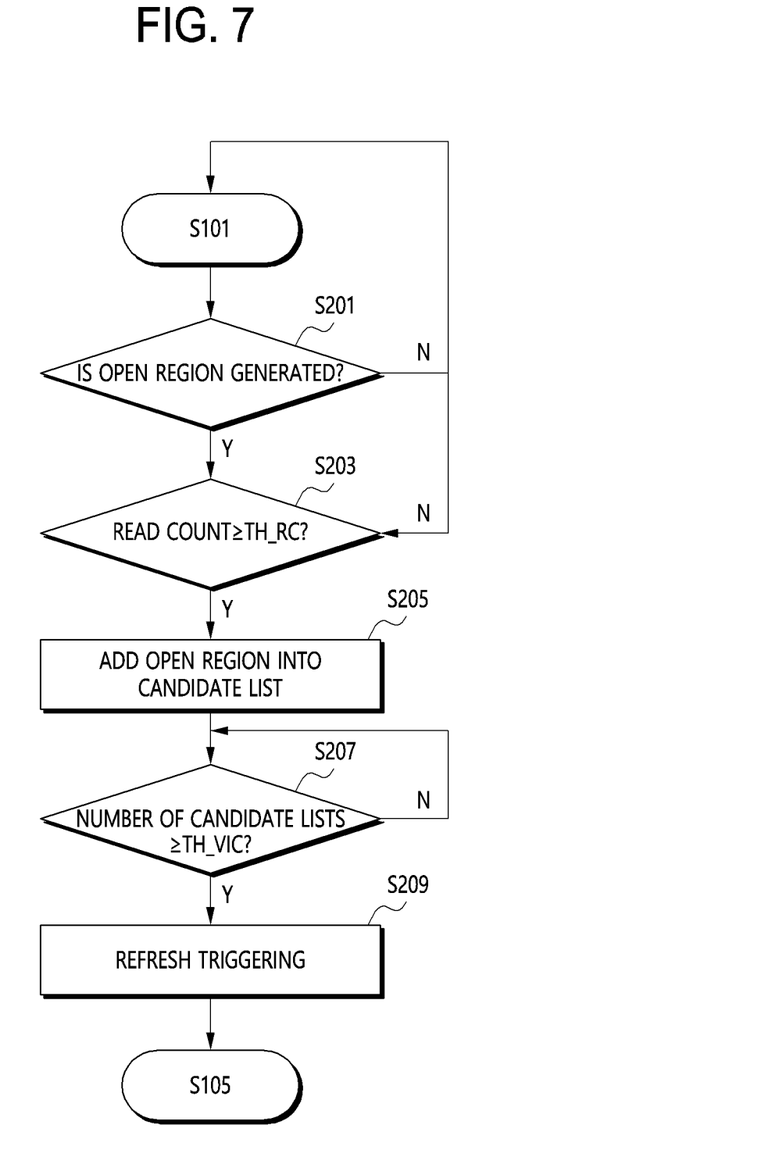
FIG. 7 is a flowchart for describing an operating method of the data storage device in accordance with an embodiment of the present disclosure.

FIG. 7 is a flowchart for describing an operating method of the data storage device 10 in accordance with an embodiment of the present disclosure, and is a detailed flowchart of the monitoring process S101 and the triggering determination process S103 of FIG. 6.

The controller 110 may monitor the state of the storage 120 (S101), and determine whether open regions are generated (S201). When the open regions are generated (S201: Y), the controller 110 may confirm whether the read count for the open region is equal to or greater than the first threshold value TH_RC (S203). The controller 110 may include an open region, whose read count is equal to or greater than the first threshold value TH_RC (S203: Y) among the open regions, in a candidate list of an early refresh operation (S205). When no open regions are generated (S201: N) and the read count of any open region is less than the first threshold value TH_RC (S203: N), the controller 110 may continuously monitor the state of the storage 120 (S101).

The controller 110 may monitor whether the number of open regions included in the candidate list is equal to or greater than the second threshold value TH_VIC (S207).

When the number of open regions included in the candidate list is equal to or greater than the second threshold value TH_VIC (S207: Y), the controller 110 may trigger the early refresh operation (S209). In addition, the controller 110 may select open regions whose number corresponds to the second threshold value TH_VIC, as target open regions of the early refresh operation, the read count of each of the open regions being equal to or greater than the first threshold value TH_RC, and proceed to the process of operation S105 in FIG. 6.

When the number of open regions included in the candidate list does not reach the second threshold value TH_VIC, the controller 110 may continuously check whether the number of candidate lists satisfies the second threshold value TH_VIC (S207: N).

Consequently, it is possible to differently determine the refresh time points according to a read count and open state retention characteristics of each target open region, and distribute refresh time points for respective target open regions. Furthermore, it is possible to respond to a request of a host device without delay while performing a refresh operation in order in which refresh is urgent.

Figure 8:
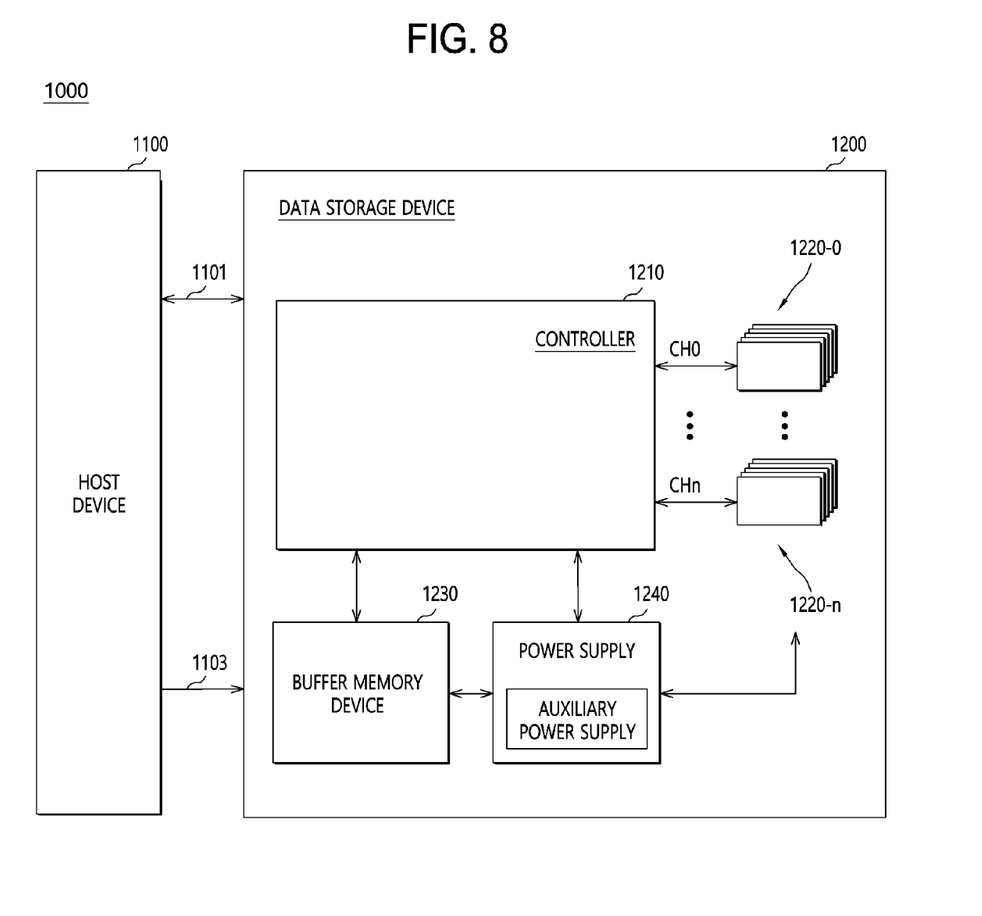
FIG. 8 is a diagram illustrating a data storage system in accordance with an embodiment of the present disclosure.

FIG. 8 is a diagram illustrating a data storage system 1000, in accordance with an embodiment of the present disclosure.

Referring to FIG. 8, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface circuit, a controller, a random access memory used as a working memory, an error correction code (ECC) circuit, and a memory interface circuit. In an embodiment, the controller 1210 may configured as controller 110 shown in FIGS. 1 to 5.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103 to the controller 1210, the nonvolatile memory devices 1220-0 to 1220-n and the buffer memory device 1230 of the data storage device 1200. The power supply 1240 may include an auxiliary power supply. The auxiliary power supply may supply power to allow the data storage device 1200 to be normally terminated when a sudden power interruption occurs. The auxiliary power supply may include bulk-capacity capacitors sufficient to store the needed charge.

The signal connector 1101 may be configured as one or more of various types of connectors depending on an interface scheme between the host device 1100 and the data storage device 1200.

The power connector 1103 may be configured as one or more of various types of connectors depending on a power supply scheme of the host device 1100.

Figure 9:
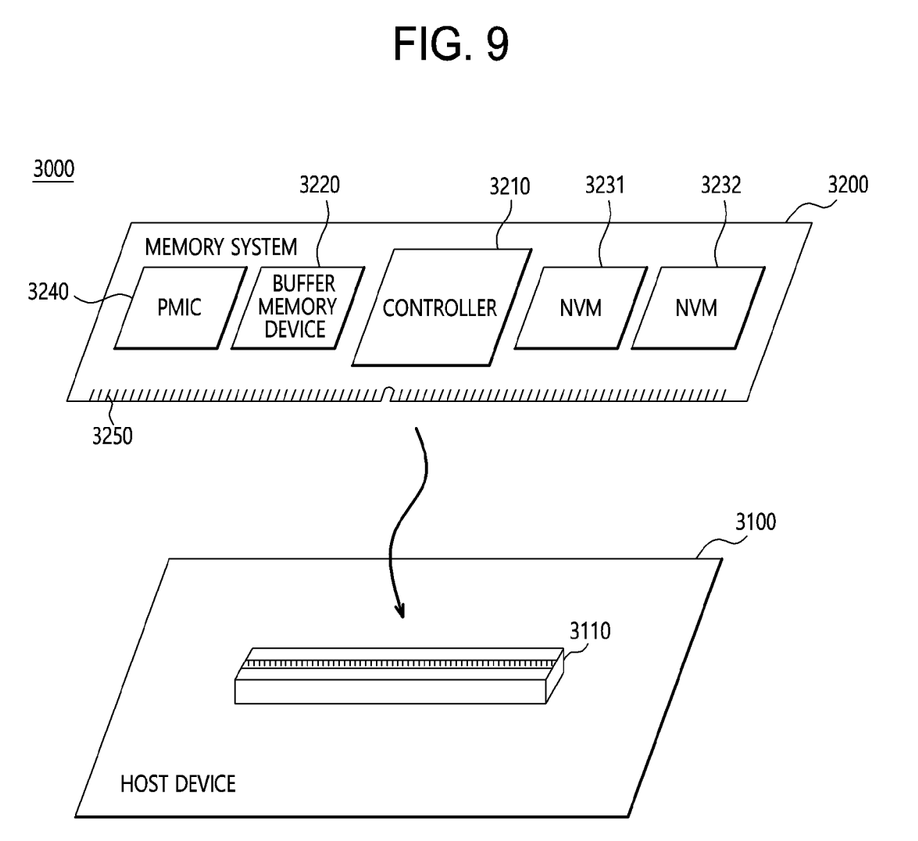
FIG. 9 and FIG. 10 are diagrams illustrating a data processing system in accordance with an embodiment of the present disclosure.

FIG. 9 is a diagram illustrating a data processing system 3000, in accordance with an embodiment of the present disclosure. Referring to FIG. 9, the data processing system 3000 may include a host device 3100 and a memory system 3200.

The host device 3100 may be configured in the form of a board, such as a printed circuit board. Although not shown, the host device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 shown in FIGS. 1 to 5.

The buffer memory device 3220 may temporarily store data to be stored in the nonvolatile memory devices 3231 and 3232. Further, the buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and so forth, and power may be transferred between the host device 3100 and the memory system 3200. The connection terminal 3250 may be configured as one or more of various types depending on an interface scheme between the host device 3100 and the memory system 3200. The connection terminal 3250 may be disposed on a side of the memory system 3200, as shown.

Figure 10:
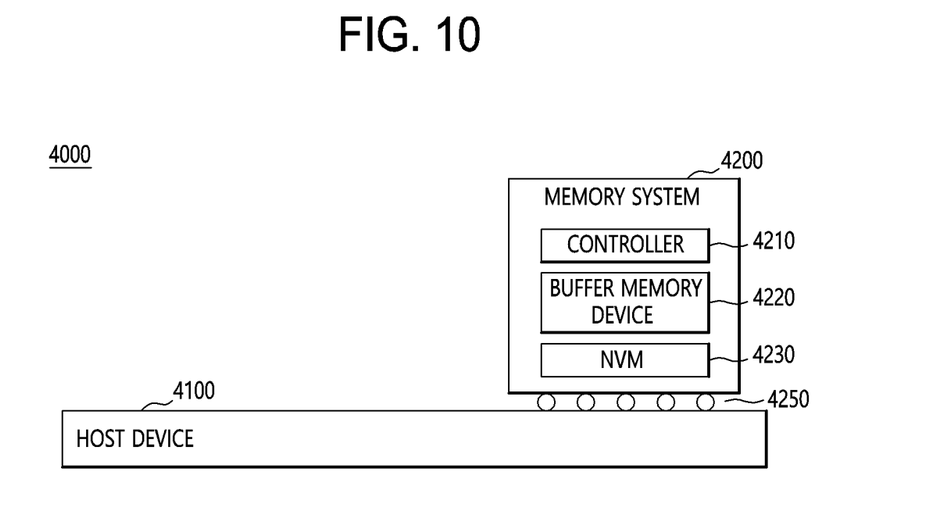

FIG. 10 is a diagram illustrating a data processing system 4000 in accordance with an embodiment of the present disclosure. Referring to FIG. 10, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 shown in FIGS. 1 to 5.

The buffer memory device 4220 may temporarily store data to be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 11:
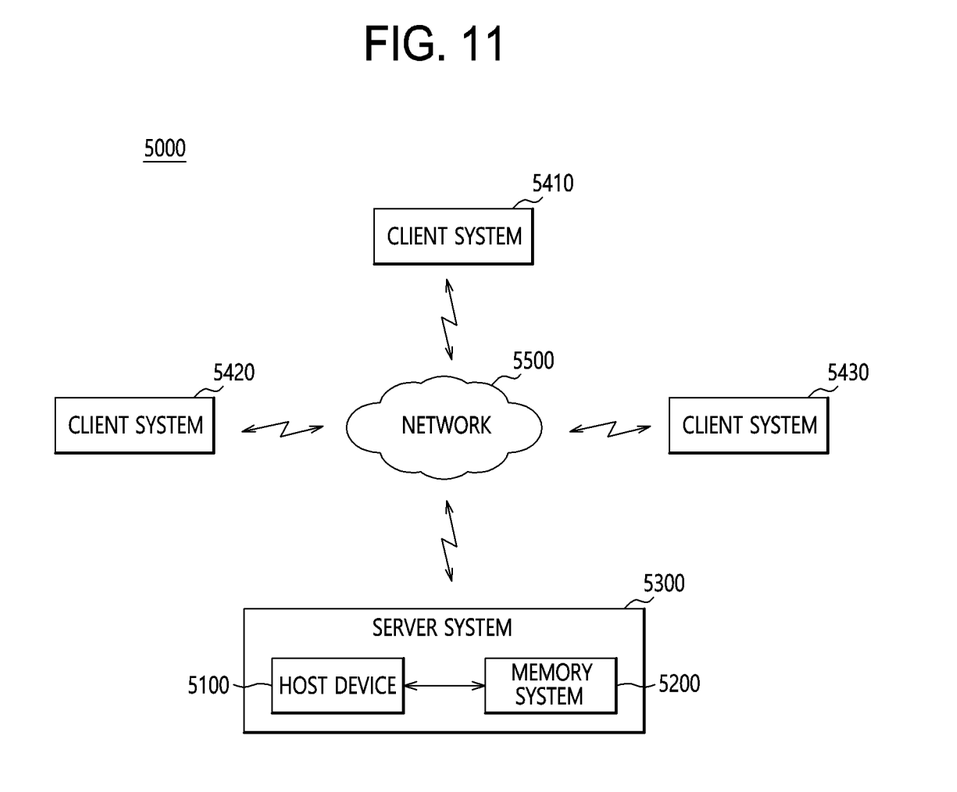
FIG. 11 is a diagram illustrating a network system including a data storage device in accordance with an embodiment of the present disclosure.

FIG. 11 is a diagram illustrating a network system 5000 including a data storage device, in accordance with an embodiment of the present disclosure. Referring to FIG. 11, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may be configured as the data storage apparatus 10 shown in FIG. 1, the data storage device 1200 shown in FIG. 8, the memory system 3200 shown in FIG. 9, or the memory system 4200 shown in FIG. 10.

Figure 12:
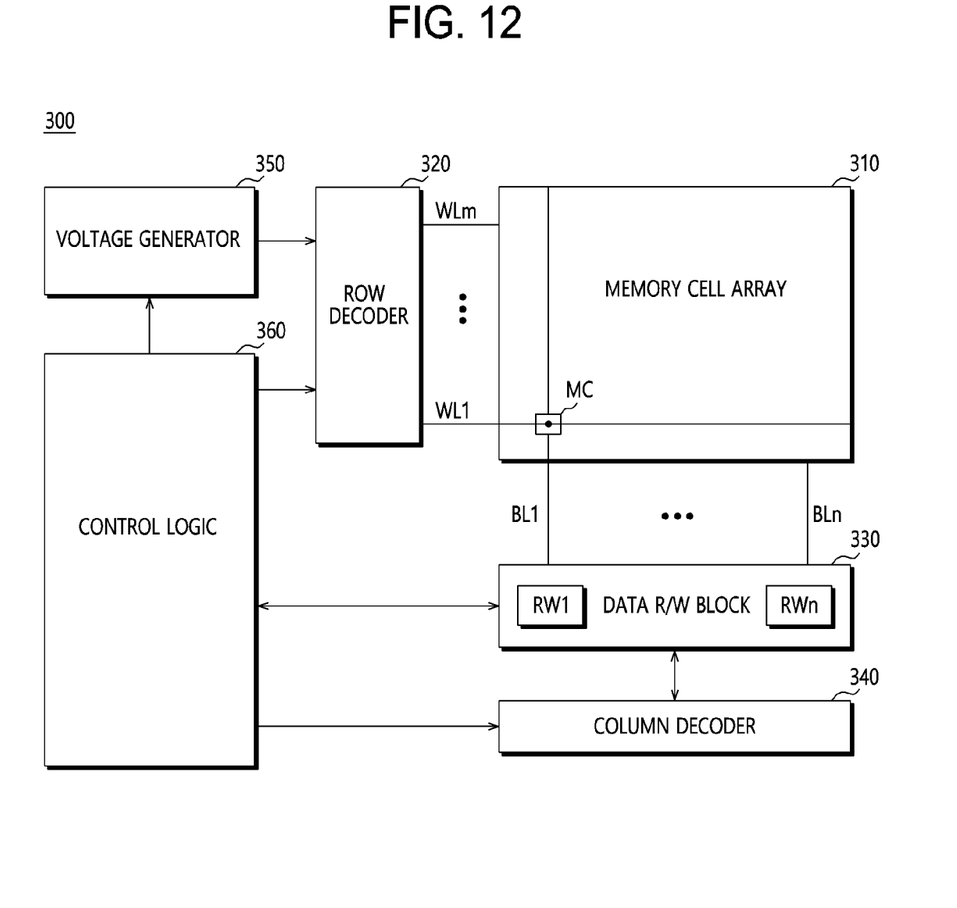
FIG. 12 is a block diagram illustrating a nonvolatile memory device included in a data storage device in accordance with an embodiment of the present disclosure.

FIG. 12 is a block diagram illustrating a nonvolatile memory device 300 included in a data storage device, such as the data storage device 10, in accordance with an embodiment of the present disclosure. Referring to FIG. 12, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure in a perpendicular direction to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, the NAND strings of the three-dimensional memory array memory cells are arranged in the horizontal and vertical directions with respect to the surface of the semiconductor substrate. The memory cells may be variously spaced to provide different degrees of integration The row decoder 320 may be coupled with the memory cell array 310 through the word lines WL1 to WLm. The row decoder 320 may operate according to control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate according to control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate according to control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided by the external device. For example, the control logic 360 may control operations of the nonvolatile memory device 300 such as read, write, and erase operations of the nonvolatile memory device 300.

The above-described embodiments of the present disclosure are intended to illustrate and not to limit embodiments of the present disclosure. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims. Furthermore, the embodiments may be combined to form additional embodiments.

What is claimed is:

1. A data storage device comprising:
a storage including a plurality of storage regions each composed of a plurality of pages; and
a controller configured to:
select a plurality of target open regions from open regions among the storage regions on the basis of health information of the open regions, in each of which a programmed page and an unprogrammed page coexist, and
perform control so that refresh operations for the respective target open regions are performed in a time-distributed manner,
wherein the controller selects the plurality of target open regions by:
selecting, as candidates, open regions having the health information equal to or greater than a first threshold value among the open regions, and
selecting at least a part of the candidates as the target open regions.

2. The data storage device according to claim 1, wherein the health information includes first health information including a read count for each of the open regions and second health information including a number of programmed pages for the open region and/or an elapsed time after the open region is generated.

3. The data storage device according to claim 1, wherein the health information includes a read count.

4. The data storage device according to claim 1, wherein the controller is further configured to:

determine disturbance vulnerability of each of the target open regions on the basis of the health information including open state retention characteristics for each of the plurality of target open regions, and determine a refresh priority of each of the target open regions, the refresh priority being in proportion to the disturbance vulnerability.

5. The data storage device according to claim 4, wherein the open state retention characteristics include a number of programmed pages within each of the target open regions and/or an elapsed time after the target open region is generated.

6. The data storage device according to claim 1, wherein the controller performs control so that the plurality of target open regions are refreshed at different time points through the refresh operations of the time-distributed manner.

7. The data storage device according to claim 1, wherein the refresh operation includes an operation of moving data in the target open region to another storage region.

8. A data storage device comprising:
 a storage including a plurality of storage regions each composed of a plurality of pages, at least a part of the storage regions being open regions, in each of which a programmed page and an unprogrammed page coexist;
 an open region manager configured to select, as target open regions, at least a part of open regions, a read count of each of which is equal to or greater than a threshold value among the open regions; and
 a refresh controller configured to set a refresh period so that refresh time points of the respective target open regions are distributed on the basis of disturbance vulnerability of each of the target open regions.

9. The data storage device according to claim 8, wherein the refresh controller is further configured to determine the disturbance vulnerability of each of the target open regions on the basis of a number of programmed pages within each of the target open regions and/or an elapsed time after the target open region is generated.

10. The data storage device according to claim 8, wherein the refresh controller is further configured to perform control so that the plurality of target open regions are refreshed at different time points through refresh operations performed on the target open regions according to the distributed refresh time points.

11. The data storage device according to claim 8, wherein a refresh operation performed according to the refresh period includes an operation of moving data in the target open region to another storage region.

12. An operating method of a data storage device including a controller and a storage including a plurality of storage regions each composed of a plurality of pages, the operating method comprising:
 generating, by the storage, open regions, in each of which a programmed page and an unprogrammed page coexist;
 selecting, by the controller, a plurality of target open regions on the basis of health information of the open regions; and performing, by the controller, control so that refresh operations for the respective target open regions are performed in a time-distributed manner,
 wherein the selecting includes:
 selecting, as candidates, open regions having the health information equal to or greater than a first threshold value among the open regions; and
 selecting at least a part of the candidates as the target open regions.

13. The operating method according to claim 12, wherein the health information includes first health information including a read count for each of the open regions and second health information including a number of programmed pages for the open region and/or an elapsed time after the open region is generated.

14. The operating method according to claim 12, wherein the
 health information includes a read count.

15. The operating method according to claim 12, further comprising:
 determining, by the controller, disturbance vulnerability of each of the target open regions on the basis of the health information including open state retention characteristics for each of the plurality of target open regions; and
 determining, by the controller, a refresh priority of each of the target open regions, the refresh priority being in proportion to the disturbance vulnerability.

16. The operating method according to claim 15, wherein the open state retention characteristics include a number of programmed pages within each of the target open regions and/or an elapsed time after the target open region is generated.

17. The operating method according to claim 12, wherein the performing includes performing control so that the plurality of target open regions are refreshed at different time points through the refresh operations of the time-distributed manner.

18. The operating method according to claim 12, wherein the refresh operation includes an operation of moving data in the target open region to another storage region.

19. An operating method of a controller, the operating method comprising:
 selecting one or more open regions within a memory device, each open region having a greater read count than a threshold;
 determining priorities of the open regions; and
 controlling the memory device to sequentially move, according to the priorities, data from the respective open regions to one or more other storage regions therein,
 wherein the priority of an open region is inversely proportional to a number of programmed pages within the open region and/or is proportional to a time amount elapsed since the open region becomes open.

* * * * *